United States Patent
Yao et al.

(10) Patent No.: US 9,293,413 B2
(45) Date of Patent: Mar. 22, 2016

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Hsin-Chieh Yao, Hsin-Chu (TW); Chung-Ju Lee, Hsin-Chu (TW); Tien-I Bao, Dayuan Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/721,864

(22) Filed: May 26, 2015

(65) Prior Publication Data

US 2015/0255390 A1    Sep. 10, 2015

Related U.S. Application Data

(62) Division of application No. 14/046,516, filed on Oct. 4, 2013, now Pat. No. 9,040,417.

(51) Int. Cl.
| | |
|---|---|
| *H01L 23/48* | (2006.01) |
| *H01L 23/52* | (2006.01) |
| *H01L 29/40* | (2006.01) |
| *H01L 23/522* | (2006.01) |
| *H01L 21/768* | (2006.01) |
| *H01L 23/532* | (2006.01) |

(52) U.S. Cl.
CPC ...... *H01L 23/5226* (2013.01); *H01L 21/76802* (2013.01); *H01L 23/522* (2013.01); *H01L 23/53228* (2013.01); *H01L 23/53233* (2013.01); *H01L 23/53295* (2013.01); *H01L 2924/0002* (2013.01)

(58) Field of Classification Search
CPC .............. H01L 23/522; H01L 23/5226; H01L 23/5395; H01L 23/53233; H01L 23/53228
USPC ........................................... 257/773
See application file for complete search history.

(56) References Cited

U.S. PATENT DOCUMENTS

| | | | |
|---|---|---|---|
| 2006/0118962 A1* | 6/2006 | Huang | H01L 21/76805 257/760 |
| 2014/0264895 A1 | 9/2014 | Sung et al. | |
| 2014/0264926 A1 | 9/2014 | Wu et al. | |
| 2015/0061141 A1* | 3/2015 | Tung | H01L 23/53223 257/773 |
| 2015/0069620 A1* | 3/2015 | Chi | H01L 23/5226 257/774 |

* cited by examiner

*Primary Examiner* — David S Blum
(74) *Attorney, Agent, or Firm* — Slater & Matsil, L.L.P.

(57) ABSTRACT

Semiconductor devices and methods of manufacture thereof are disclosed. In some embodiments, a method of manufacturing a semiconductor device includes forming an insulating material layer over a workpiece, patterning an upper portion of the insulating material layer with a conductive line pattern, and forming a stop layer comprising a metal oxide or a metal nitride over the patterned insulating material layer. A masking material is formed over the stop layer, and the masking material is patterned with a via pattern. The via pattern of the masking material is transferred to a lower portion of the insulating material layer.

20 Claims, 8 Drawing Sheets

SEMICONDUCTOR DEVICES AND METHODS OF MANUFACTURE THEREOF

PRIORITY CLAIM

This application claims the benefit to and is a divisional of U.S. patent application Ser. No. 14/046,516, now U.S. Pat. No. 9,040,417, filed on Oct. 4, 2013 and entitled "Semiconductor Devices and Methods of Manufacture Thereof" which application is incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line.

The semiconductor industry continues to improve the integration density of various electronic components (e.g., transistors, diodes, resistors, capacitors, etc.) by continual reductions in minimum feature size, which allow more components to be integrated into a given area. As feature sizes are decreased, patterning techniques become more challenging.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance. Copper is now often used as a conductive material for interconnects in some applications. Low dielectric constant (k) materials that have dielectric constants less than a dielectric constant of silicon dioxide have begun to be implemented in some designs as insulating materials between interconnects.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to manufacturing methods and structures for semiconductor devices. Novel methods of forming conductive features of semiconductor devices will be described herein.

Figure 1:
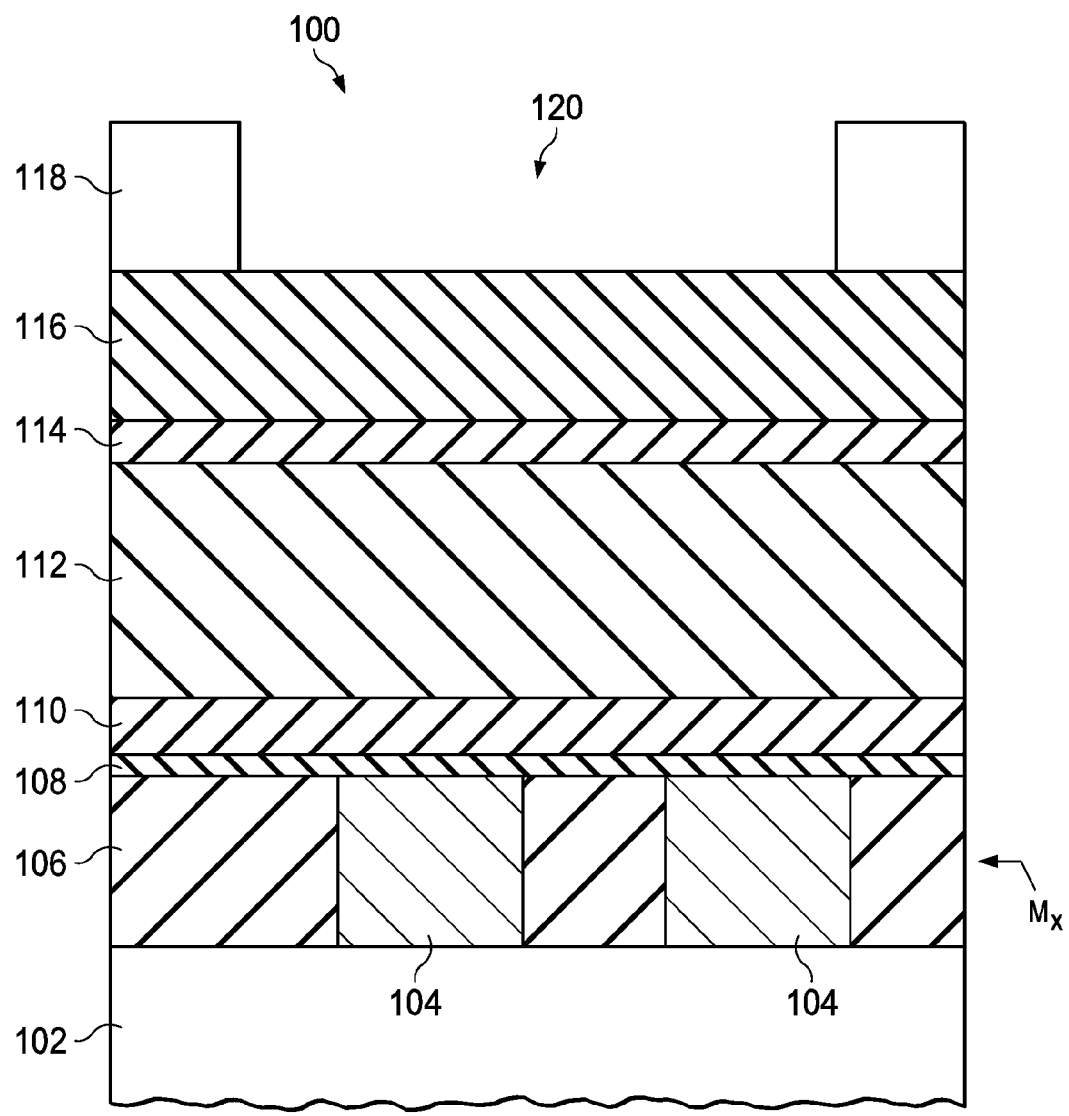
FIGS. 1 through 8 are cross-sectional views of a semiconductor device that illustrate a method of manufacturing a semiconductor device in accordance with some embodiments of the present disclosure.

FIGS. 1 through 8 are cross-sectional views illustrating a method of manufacturing a semiconductor device 100 at various stages in accordance with some embodiments of the present disclosure. Referring first to FIG. 1, to manufacture the semiconductor device 100, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A plurality of first conductive lines 104 is disposed over the workpiece 102 within a first insulating material layer 106. The plurality of first conductive lines 104 comprise copper or a copper alloy and may include a barrier layer and/or seed layer (not shown) in some embodiments. The first insulating material layer 106 may comprise a low dielectric constant (k) material having a dielectric constant of less than a dielectric constant of silicon dioxide, which is about 3.9, in some embodiments. In other embodiments, the first insulating material layer 106 may comprise an extra low-k (ELK) material having a dielectric constant of about 3.0 or less, as another example. The first insulating material 106 comprises Si, O, and C in some embodiments, for example. The first insulating material 106 may comprise SiOC, as an example. The first insulating material 106 may be formed using chemical vapor deposition (CVD), a spin-on coating process, or other methods. Alternatively, the first conductive lines 104 and the first insulating material layer 106 may comprise other materials. The first conductive lines 104 and the first insulating material layer 106 may comprise a thickness of about 30 nm to about 200 nm in some embodiments. The first conductive lines 104 may have a width of about 25 nm or less and a pitch of about 50 nm or less in some embodiments. Alternatively, the first conductive lines 104 and the first insulating material layer 106 may comprise other dimensions.

The first conductive lines 104 may be formed using a damascene process, by first forming the first insulating material layer 106, patterning the first insulating material layer 106 using a lithography process, and filling the patterns in the first insulating material layer 106 with a conductive material to form the first conductive lines 104. Excess conductive material is removed from over the top surface of the first insulating material layer 106 using a chemical mechanical polishing (CMP) process and/or etch process. Alternatively, the first conductive lines 104 may be formed using a subtractive etch process, by forming a conductive material over the workpiece 102, patterning the conductive material using a lithography process to form the first conductive lines 104, and filling in spaces between the first conductive lines 104 with the first insulating material 106. The first conductive lines 104 may be formed using a plating process, a sputtering process, physical vapor deposition (PVD), or other methods. In some embodiments, the first conductive lines 104 are formed in a metallization layer $M_x$ of the semiconductor device 100. The first conductive lines 104 may extend in and out of the paper in the view shown in the drawings by a predetermined distance, which may comprise a few mm to a few µm in some embodiments, for example.

A first etch stop layer 108 is formed over the workpiece 102, also shown in FIG. 1. The first etch stop layer 108 is formed over the workpiece 102 over the first conductive lines 104 and the first insulating material layer 106. The first etch stop layer 108 comprises AlON having a thickness of about 1 nm to about 5 nm, for example. Alternatively, the first etch stop layer 108 may comprise other materials and dimensions. The first etch stop layer 108 comprises a dielectric material that has a sieve character in some embodiments. For example, the first etch stop layer 108 comprises a material that is adapted to allow growth of a subsequently-deposited conductive material (not shown in FIG. 1; see conductive material 132 shown in FIG. 7) through the first etch stop layer 108. The first etch stop layer 108 may be formed using atomic layer deposition (ALD) or CVD in a chamber having a pressure of about 1 Torr to about 30 Torr, a frequency of about 13.56 MHz, at a power level of about 50 Watts (W) to about 500 W, at a temperature of about 100 degrees C. to about 400 degrees C., and in the presence of or in an ambient of $N_2$, $H_2$, or $NH_3$, for example. Alternatively, the first etch stop layer 108 may be formed using other methods and process settings.

A second etch stop layer 110 is formed over the first etch stop layer 108, also shown in FIG. 1. The second etch stop layer 110 comprises nitrogen-doped carbide (NDC), oxygen-doped carbide (ODC), hydrogen and nitrogen doped carbide (HNDC), SiC, tetraethyl orthosilicate (TEOS), or other films comprising a thickness of about 1 nm to about 20 nm in some embodiments, as examples. Alternatively, the second etch stop layer 110 may comprise other materials and dimensions. The second etch stop layer 110 is not included in some embodiments. In some embodiments, the second etch stop layer 110 is included, but the first etch stop layer 108 is not included.

A second insulating material layer 112 is formed over the second etch stop layer 110, or over the first etch stop layer 108 in embodiments wherein the second etch stop layer 110 is not included. The second insulating material layer 112 comprises similar materials, dimensions, and formation methods as described for the first insulating material layer 106 in some embodiments. The second insulating material layer 112 may comprise the same material or a different material as the first insulating material layer 106, for example. The second insulating material layer 112 is also referred to herein, e.g., in some of the claims, as an insulating material layer.

A first hard mask 114 is formed over the second insulating material layer 112, as shown in FIG. 1. The first hard mask 114 comprises an insulating material, such as a dielectric, in some embodiments. The first hard mask 114 may comprise TEOS, a nitrogen free anti-reflective coating (NFARC), NDC, or other dielectric materials, as examples. The first hard mask 114 comprises a thickness of about 5 nm to about 50 nm in some embodiments. The first hard mask 114 may be formed using CVD, ALD, or a spin-on coating process, as examples. Alternatively, the first hard mask 114 may comprise other materials and dimensions, and may be formed using other methods. The first hard mask 114 is not included in some embodiments.

A second hard mask 116 is formed over the first hard mask 114, or over the second insulating material layer 112 in embodiments wherein the first hard mask 114 is not included. The second hard mask 116 comprises a metal oxide or a metal nitride in some embodiments. In some embodiments, the second hard mask 116 comprises TiN or TiO, for example. The second hard mask 116 may be deposited using physical vapor deposition PVD, CVD, plasma-enhanced CVD (PECVD), or ALD, in some embodiments. The second hard mask 116 comprises a thickness of about 5 nm to about 50 nm thick in some embodiments. Alternatively, the second hard mask 116 may comprise other materials and dimensions, and may be formed using other methods. In some embodiments, the second hard mask 116 is not included, e.g., in embodiments wherein the first hard mask 114 is included.

A layer of photoresist 118 is formed over the second hard mask 116, or over the first hard mask 114 in embodiments wherein the second hard mask 116 is not included. The layer of photoresist 118 is patterned with a pattern 120 for a plurality of conductive lines using a lithography process. Only one conductive line pattern 120 is shown in FIG. 1; however, a plurality of conductive line patterns 120 is formed across a surface of the workpiece 102 in accordance with some embodiments.

Figure 2:
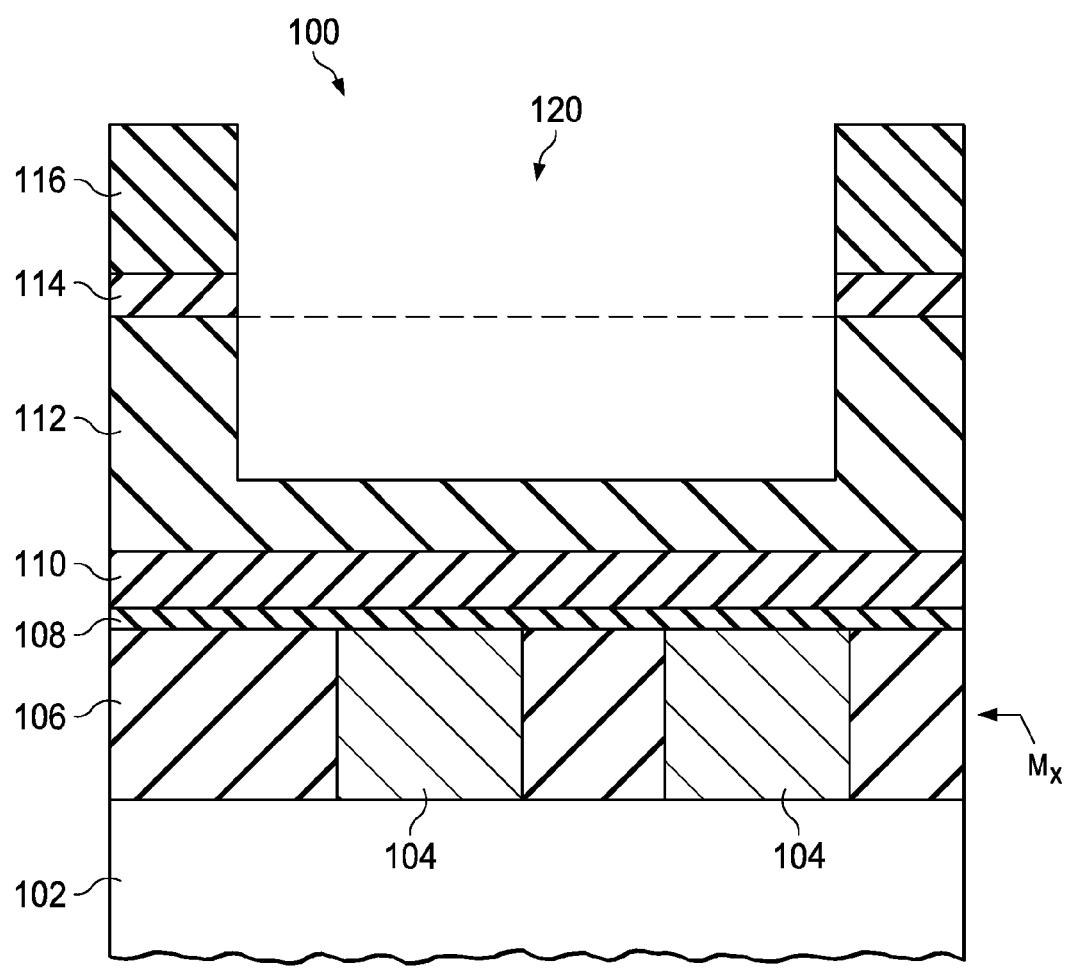

The conductive line pattern 120 of the photoresist 118 is then transferred to the second hard mask 116 and the first hard mask 114, as shown in FIG. 2 in phantom (e.g., in dashed lines). The photoresist 118 is used as an etch mask during an etch process in order to transfer the conductive line pattern 120 of the photoresist 118 to the second hard mask 116 and the first hard mask 114, for example. The photoresist 118 is then removed, and the second hard mask 116 and the first hard mask 114 are used as an etch mask during an etch process for the second insulating material layer 112 to transfer the conductive line pattern 120 to an upper portion of the second insulating material layer 112, also illustrated in FIG. 2.

Figure 3:
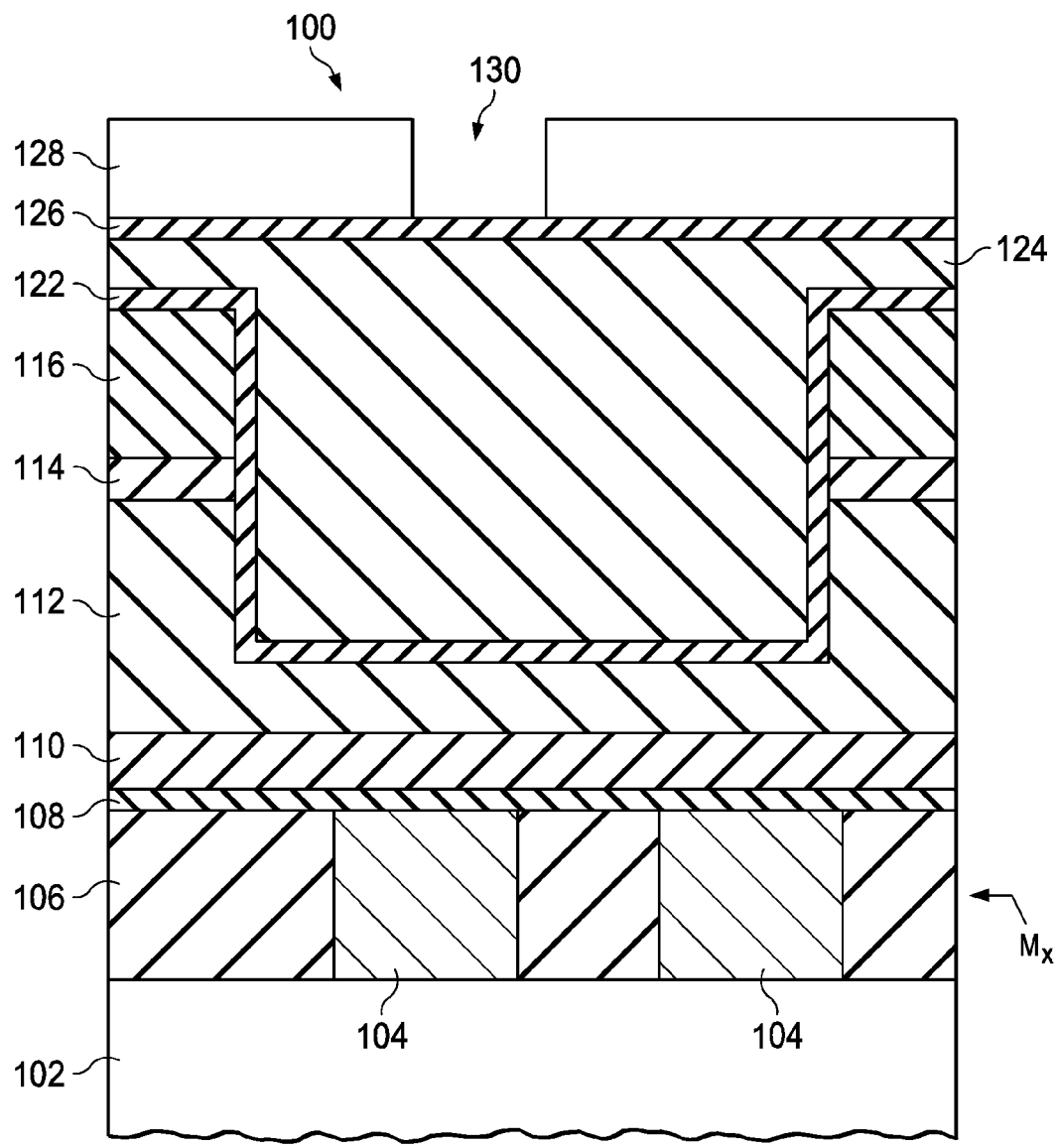

A stop layer 122 is formed over the patterned second hard mask 116, the patterned first hard mask 114, and the patterned second insulating material 112, as shown in FIG. 3. The stop layer 122 comprises a metal oxide or a metal nitride in some embodiments. The stop layer 122 comprises TiN or TiO in some embodiments, as examples. The stop layer 122 may alternatively comprise other materials having a high etch selectivity to the material of the second insulating material 112 and that are easily removable using a wet etch process, for example. The stop layer 122 is deposited using PVD at a temperature of room temperature to about 400 degrees C., using CVD or plasma enhanced CVD (PECVD) at a temperature of about 200 degrees C. to about 600 degrees C., or using ALD at a temperature of about 80 degrees C. to about 600 degrees C., as examples. The stop layer 122 comprises a thickness of about 1 nm to about 10 nm in some embodiments. Alternatively, the stop layer 122 may comprise other materials and dimensions, and may be formed using other methods. In some embodiments, the stop layer 122 is not included, e.g., in embodiments wherein the first etch stop layer 108 is included.

A bottom transfer layer 124 is formed over the stop layer 122, as shown in FIG. 3, or over the patterned second hard mask 116, the patterned first hard mask 114, and the patterned second insulating material 112 in embodiments wherein the stop layer 122 is not included. The bottom transfer layer 124 comprises about 50 nm to about 200 nm of a bottom ARC material or photoresist material in some embodiments. A middle transfer layer 126 is formed over the bottom transfer layer 126. The middle transfer layer 126 comprises about 10 nm to about 40 nm of a photoresist comprising silicon in some embodiments. Alternatively, the bottom transfer layer 124 and the middle transfer layer 126 may comprise other materials and dimensions. The bottom transfer layer 124 and the middle transfer layer 126 are also collectively referred to herein, e.g., in some of the claims, as a masking material 124/126.

A layer of photoresist 128 is formed over the middle transfer layer 126, also shown in FIG. 3. The layer of photoresist 128 is patterned with a pattern 130 for a plurality of vias. Only one pattern 130 for a via is shown in FIG. 3; however, a plurality of the via patterns 130 is formed across a surface of the workpiece 102 in accordance with some embodiments.

Figure 4:
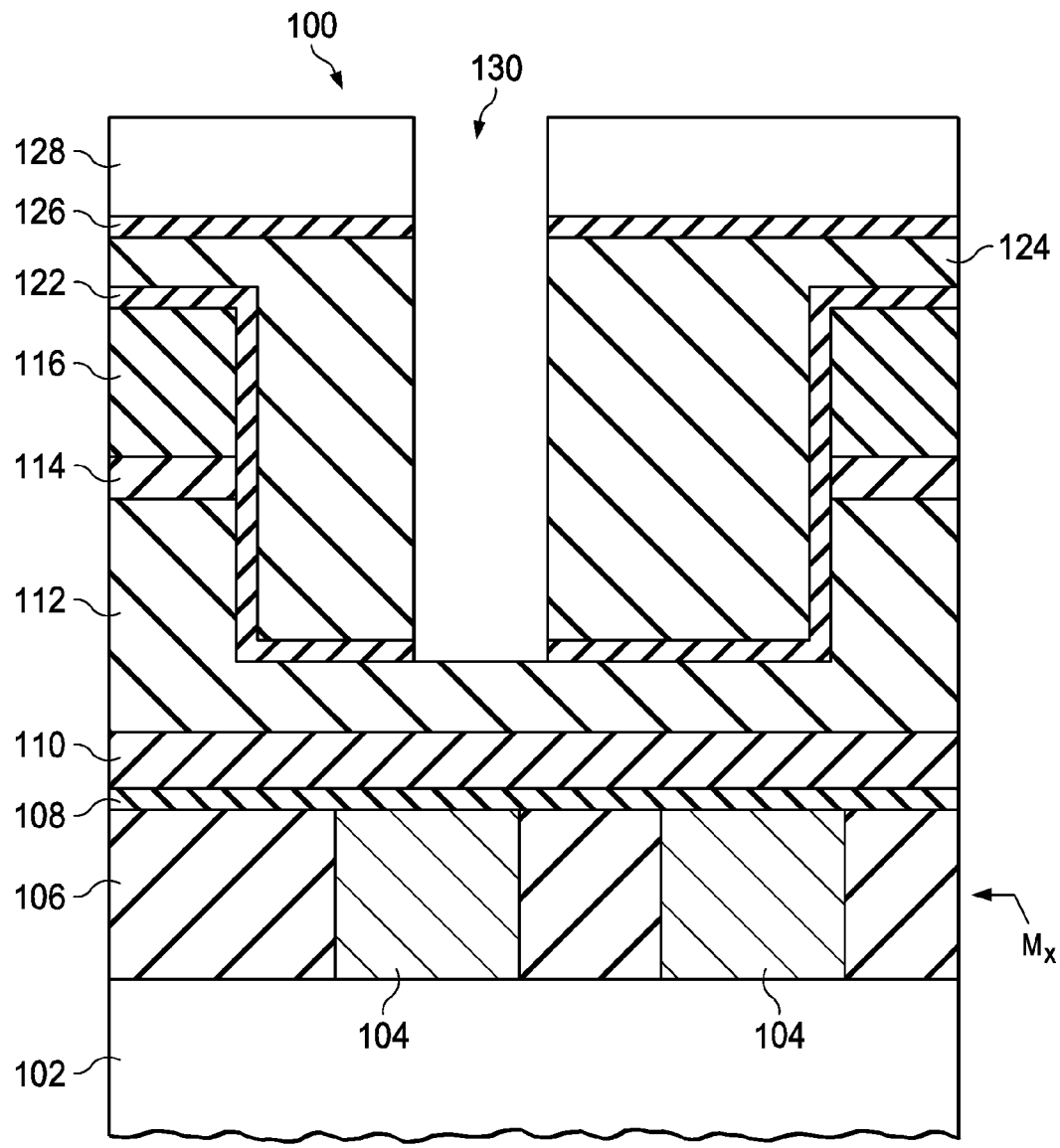

The via pattern 130 is transferred to the masking material 124/126 and stop layer 122, as shown in FIG. 4. The photoresist 128 having the via pattern 130 is used as an etch mask during an etch process for the masking material 124/126 and the stop layer 122 in some embodiments, for example.

Figure 5:
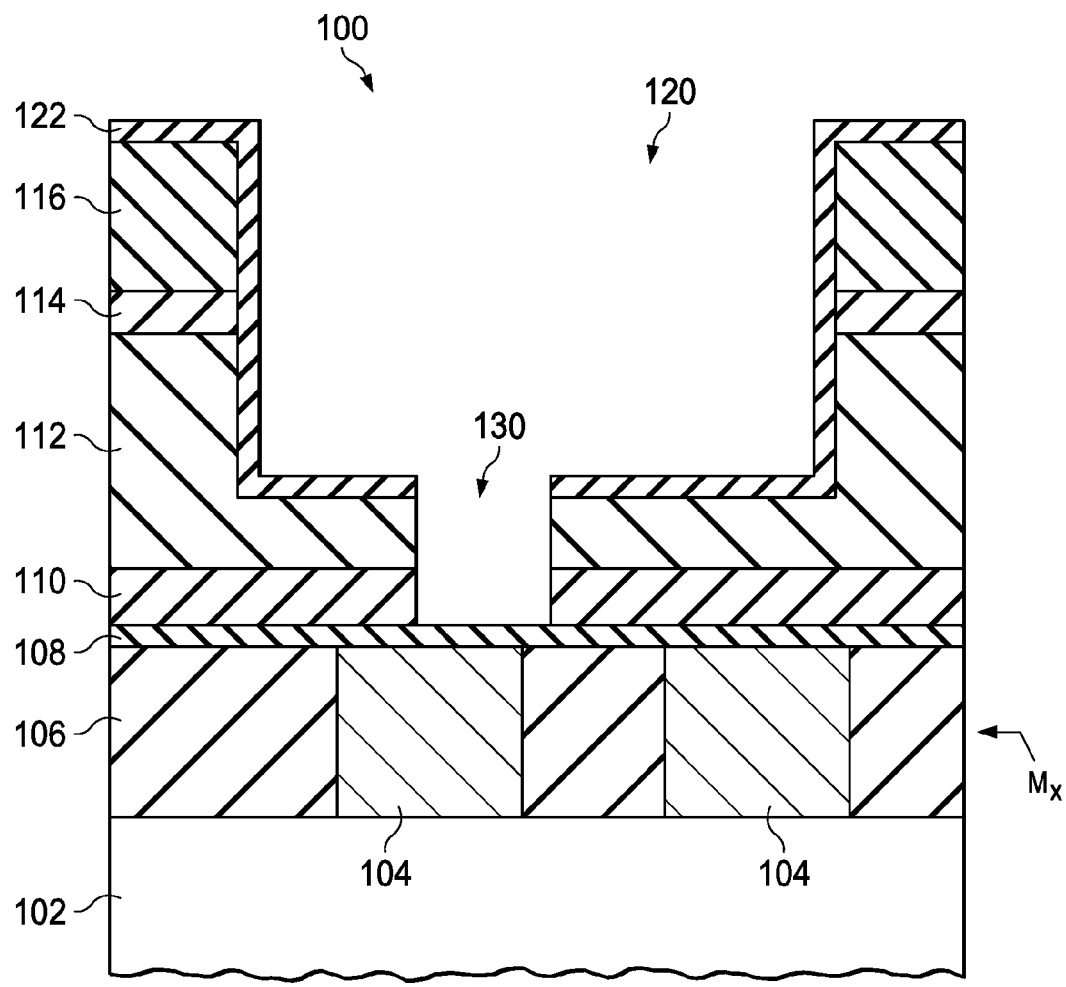

The layer of photoresist 128 is then removed, and the via pattern 130 of the masking material 124/126 is transferred to a lower portion of the second insulating material layer 112, as shown in FIG. 5. Transferring the via pattern 130 of the masking material 124/126 to the lower portion of the second insulating material layer 112 comprises etching the lower portion of the second insulating material layer 112 using the masking material 124/126 as an etch mask in some embodiments, for example. In embodiments wherein the second etch stop layer 110 is included, the via pattern 130 of the masking material 124/126 is also transferred to the second etch stop layer 110 during the etch process of the second insulating material layer 112 or using a separate etch process, also shown in FIG. 5. In embodiments wherein the first etch stop layer 108 is included, the first etch stop layer 108 is left remaining and is not patterned, also shown in FIG. 5. The masking material 126/128 is then removed.

Figure 6:
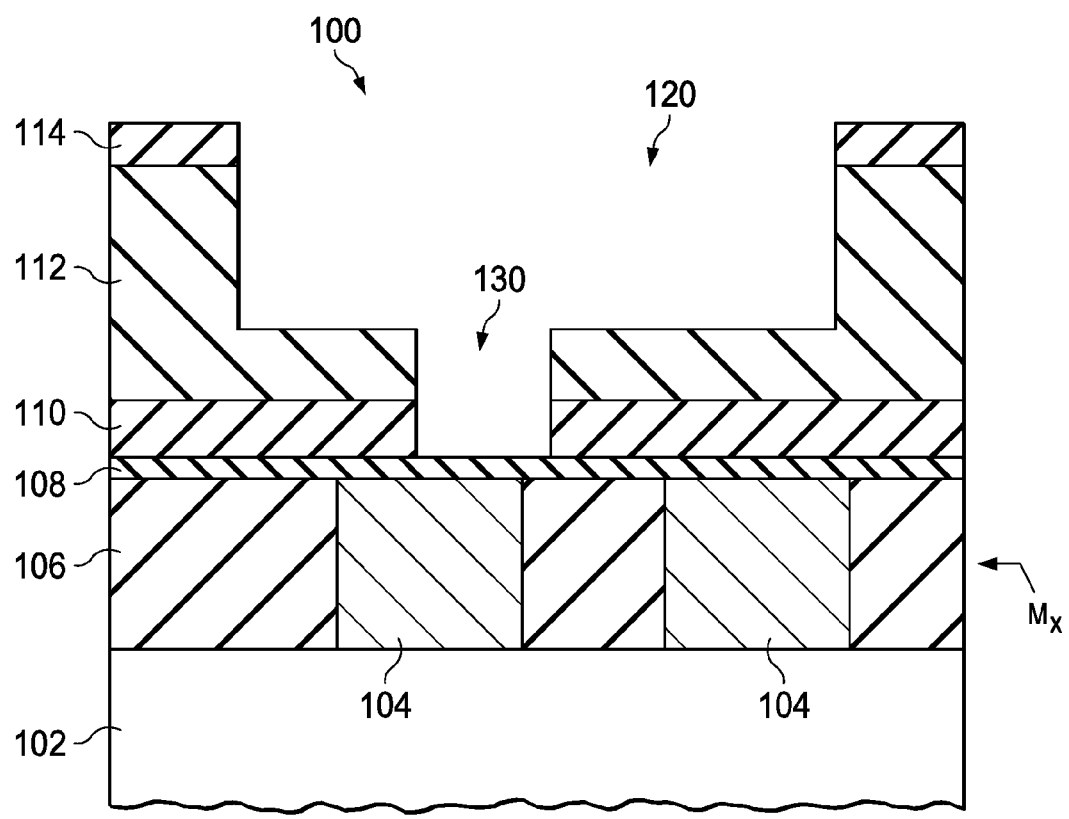

The stop layer 122 and the second hard mask 116 are then removed, as shown in FIG. 6. Advantageously, the stop layer 122 and the second hard mask 116 comprise the same material in some embodiments, so that the stop layer 122 and the second hard mask 116 are removed using a single etch process. The stop layer 122 and the second hard mask 116 both comprise TiN in some embodiments, for example. The stop layer 122 and the second hard mask 116 are removed using a wet etch process in some embodiments. Alternatively, other types of etch processes may be used to remove the stop layer 122 and the second hard mask 116.

Figure 7:
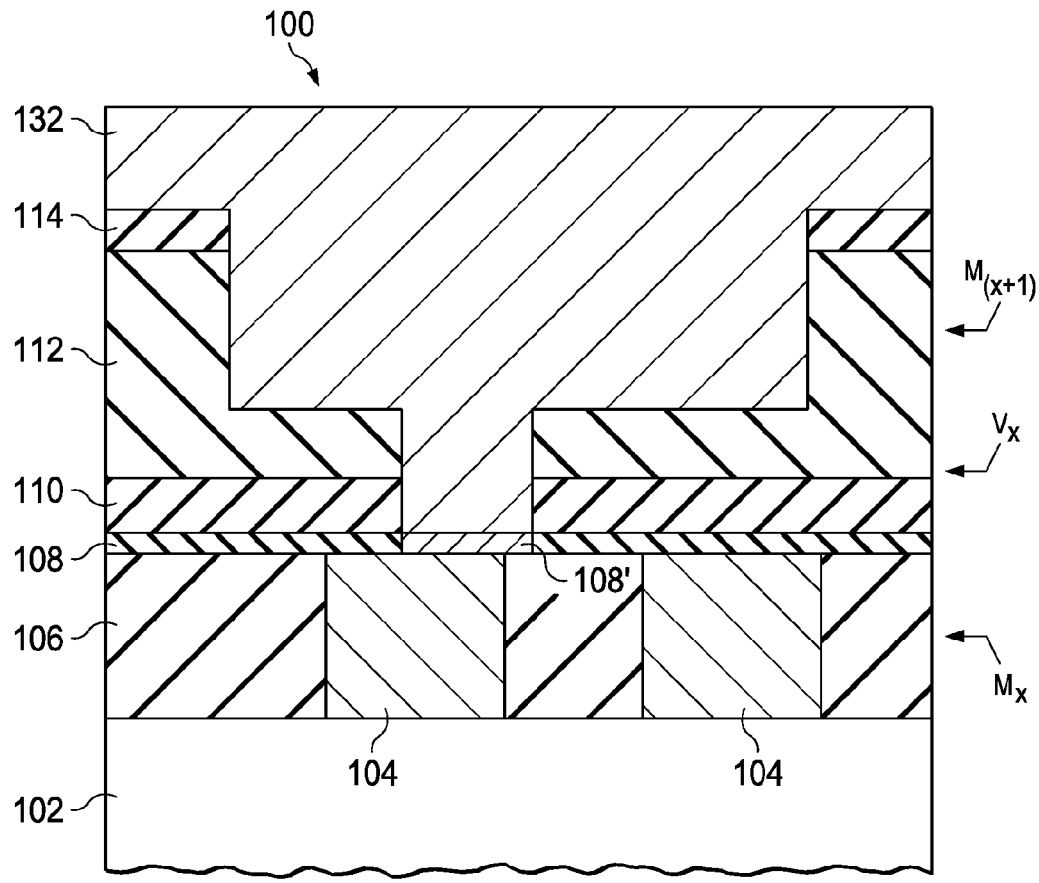

A conductive material 132 is formed over the patterned second insulating material layer 112, the patterned first hard mask 114, and the patterned second etch stop layer 110, and the first etch stop layer 108, in embodiments wherein the first hard mask 114, the second etch stop layer 110, and the first etch stop layer 108 are included in the structure of the semiconductor device 100, as shown in FIG. 7. The conductive material 132 comprises copper or a copper alloy and may include a barrier layer and/or seed layer (not shown) in some embodiments. The conductive material 132 may be formed using electrochemical plating (ECP), PVD, sputtering, other methods, or combinations thereof, as examples. The conductive material 132 may alternatively comprise other materials and may be formed using other methods.

Figure 8:
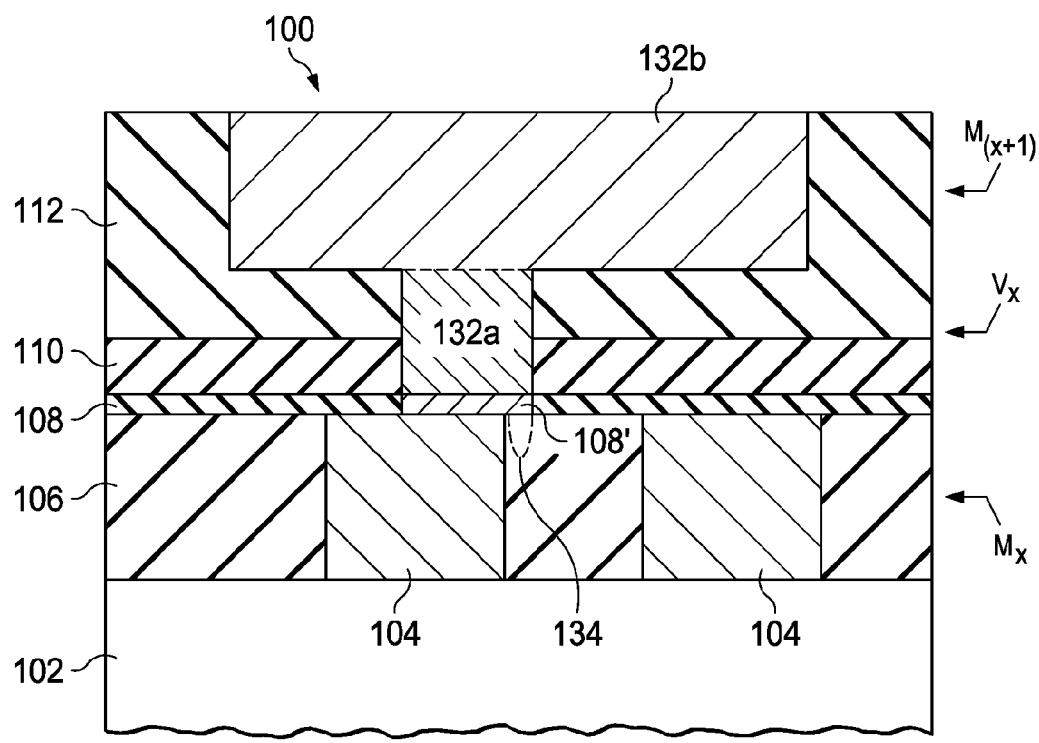

The first hard mask 114 and excess portions of the conductive material 132 are removed from over and above a height of the top surfaces of the second insulating material layer 112 using a CMP process and/or etch process, as shown in FIG. 8. The conductive material 132 left remaining in the second insulating material layer 112 comprises a second conductive line 132b formed in a metallization layer $M_{(x+1)}$ of the semiconductor device 100 and a via 132a formed in a via layer $V_x$ of the semiconductor device 100. The second conductive line 132b is formed within the conductive line pattern 120 (see FIG. 6) in the upper portion of the second insulating material layer 112, and the via 132a is formed within the via pattern 130 in the lower portion of the second insulating material layer 112 and also the patterned second etch stop layer 110, in embodiments wherein the second etch stop layer 110 is included.

The second conductive lines 132b may comprise a thickness of about 200 nm or less in some embodiments. The second conductive lines 132b may have a width of about 25 nm or less and a pitch of about 50 nm or less in some embodiments. The via 132a may be substantially circular, oval, square, rectangular, or other shapes in a top view (see FIG. 9) and may comprise a width or a diameter of about 25 nm or less in some embodiments. Alternatively, the second conductive lines 132b and vias 132b may comprise other dimensions.

Because the first etch stop layer 108 comprises sieve characteristics, the conductive material 132 grows into and through the first etch stop layer 108 material, as shown in at 108'. Portions of the first etch stop layer 108 comprise an insulative material, and other portions 108' disposed beneath the via 132a contain the conductive material 132 and are conductive so that the via 132a is electrically coupled to the underlying first conductive line 104. Advantageously, if the via 132a is not fully landed as shown in FIG. 8, the first etch stop layer 108 prevents the conductive material 132 from passing beyond the first etch stop layer 108, preventing the formation of conductive material between the first conductive lines 104, as shown at 134 in phantom (e.g., in dashed lines).

Figure 9:
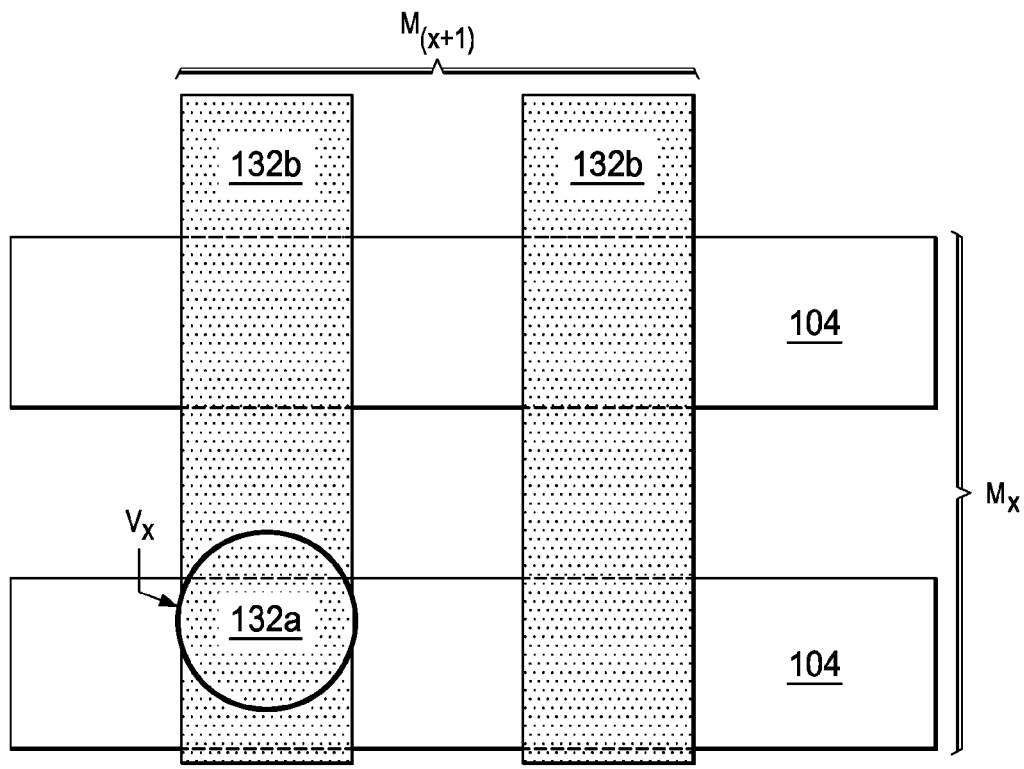
FIG. 9 is a top view illustrating a configuration of conductive lines and a via in accordance with some embodiments.

FIG. 9 is a top view illustrating a configuration of first conductive lines 104, the via 132a, and second conductive lines 132b in accordance with some embodiments. The second conductive lines 132b formed in metallization layer $M_{(x+1)}$ are substantially perpendicular to the first conductive lines 104 formed in metallization layer $M_x$ in some embodiments, for example. The via 132a in metallization layer $V_x$ provides electrical connection between one of the first conductive lines 104 and one of the second conductive lines 132b in some embodiments. The via 132a is electrically coupled between a first conductive line 104 in the $M_x$ layer and a second conductive line 132b of the $M_{(x+1)}$ layer in some embodiments, for example. The conductive material 132 grows through the etch stop layer 108 comprising AlON, forming region 108' (see FIG. 8) of the etch stop layer 108 that includes the conductive material 132, to electrically couple the via 132a to the conductive line 104 in the $M_x$ layer in some embodiments, for example.

In FIG. 9, only two conductive lines 104 are shown in the $M_x$ layer, and only two conductive lines 132b are shown in the $M_{(x+1)}$ layer. However, dozens, hundreds, thousands or more conductive lines 104 and 132b may be formed across a workpiece 102 in accordance with some embodiments, depending on the application and semiconductor device 100 design and size.

Figure 10:
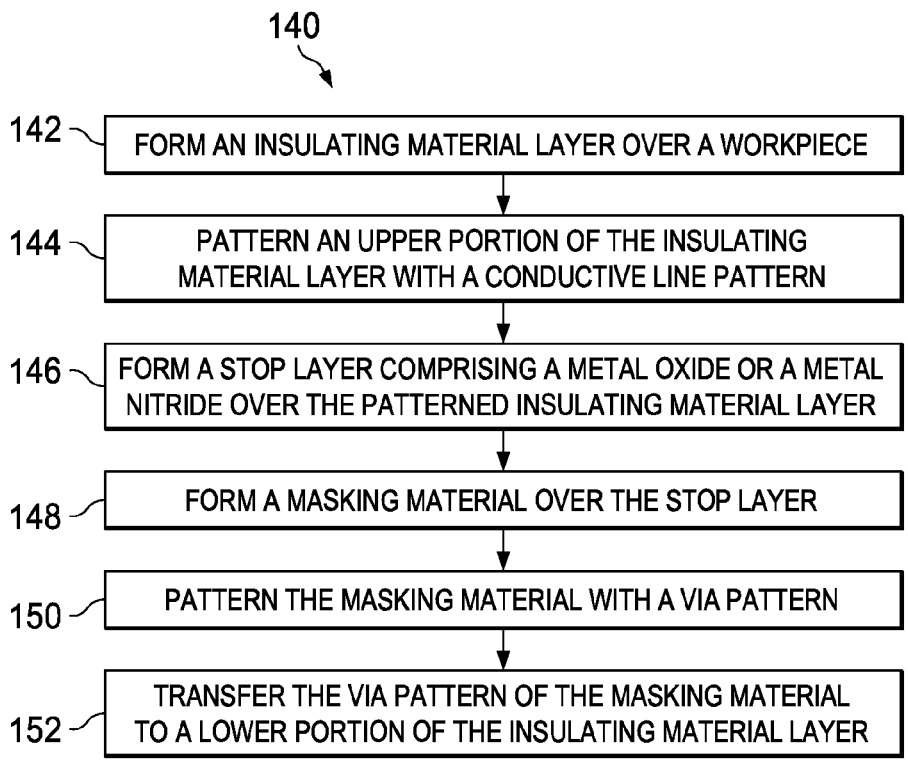
FIG. 10 is a flow chart of a method of manufacturing a semiconductor device in accordance with some embodiments.

FIG. 10 is a flow chart 140 illustrating a method of manufacturing a semiconductor device 100 in accordance with some embodiments. In step 142, an insulating material layer 112 is formed over a workpiece 102 (see also FIG. 1). In step 144, an upper portion of the insulating material layer 112 is patterned with a conductive line pattern 120 (see FIG. 2). In step 146, a stop layer 122 comprising a metal oxide or a metal nitride is formed over the patterned insulating material layer 112 (see FIG. 3). A masking material 124/126 is formed over the stop layer 122 (see FIG. 3) in step 148. The masking material 124/126 is patterned with a via pattern 130 (see FIG. 4) in step 150. In step 152, the via pattern 130 of the masking material 124/126 is transferred to a lower portion of the insulating material layer 112 (see FIG. 5).

Some embodiments of the present disclosure include methods of manufacturing semiconductor devices 100. Other embodiments of the present disclosure also include semiconductor devices 100 that have been manufactured using the novel manufacturing methods described herein. For example, in some embodiments, a semiconductor device 100 includes a plurality of first conductive lines 104 disposed over a workpiece 102, and an etch stop layer 108 comprising AlON disposed over the plurality of first conductive lines 104, as shown in FIG. 8. A via 132a is disposed over the etch stop layer 108 over one of the plurality of first conductive lines 104. The via 132a is disposed in a lower portion of insulating material layer 112. A second conductive line 132b is disposed over the via 132a, the second conductive line 132b being disposed in an upper portion of the insulating material layer 112. A region 108' of the etch stop layer 108 beneath the via 132a includes a material of the via 132a. In some embodiments, the plurality of first conductive lines 104, the via 132a, and the second conductive line 132b comprise copper or a copper alloy. In some embodiments, the etch stop layer 108 comprises a first etch stop layer 108, and the semiconductor device 100 further includes a second etch stop layer 110 disposed over the first etch stop layer 108. The via 132a is also formed within the second etch stop layer 110. The second etch stop layer 110 comprises NDC, ODC, HNDC, SiC, or TEOS comprising a thickness of about 1 nm to about 20 nm.

Advantages of some embodiments of the disclosure include providing novel self-aligned via patterning approaches that achieve desired via dimensions and avoid critical dimension (CD) enlargement. Formation of undesired spike-shaped or tiger-tooth conductive material (e.g., conductive material 134 shown in phantom in FIG. 8) beneath vias 132a between underlying adjacent conductive lines 104 is prevented by the use of the novel AlON etch stop layer 108 described herein. The AlON etch stop layer 108 allows growth of conductive material 132 through it, forming conductive regions 108' that make electrical connections between underlying conductive lines 104 and vias 132a, which avoids a requirement for an additional etching step to open the etch stop layer 108. The growth of the conductive material 132 through the etch stop layer 108 in conductive regions 108' advantageously has little or no impact on resistance properties (e.g., Rc or Rs) of the conductive lines 104 and vias 132a, for example.

The combination of the use of materials with high etch selectivities further improves the patterning process and avoid via CD extension and tiger tooth conductive material formation between conductive lines 104. For example, the stop layer 122, the first etch stop layer 108, and/or low k material of the second insulating material layer 112 may have a high selectivity characteristic of about 20:1, using a dry etch process for the second insulating material layer 112, in some embodiments. Including both the stop layer 122 and the first etch stop layer 108 in some embodiments provides improved confinement of the via etching process and improved control of the via dimensions, for example.

Implementing the self-aligned via approach using the novel stop layer 122 avoids via CD enlargement, which prevents or reduces time dependent dielectric breakdown (TDDB) failures. The via CD is confined by the stop layer 122 during the etch process used to form the via pattern. The stop layer 122 prevents y-extension, e.g., extension of the via pattern in a y-direction or vertical direction in a cross-sectional view of a semiconductor device 100. The stop layer 122 results in the via pattern needing to be etched and defined only once. Embodiments wherein the stop layer 122 and second hard mask 116 comprise the same material are beneficial, because the stop layer 122 and second hard mask 116 can both be removed simultaneously using a single etch step, which reduces a profile aspect ratio for improved conductive material 132 gap fill capability. Embodiments of the present disclosure are particularly useful in applications having a critical overlay budget, for example. Furthermore, the novel semiconductor device 100 structures, designs, and manufacturing methods are easily implementable in manufacturing process flows.

In accordance with some embodiments of the present disclosure, a method of manufacturing a semiconductor device includes forming an insulating material layer over a workpiece, patterning an upper portion of the insulating material layer with a conductive line pattern, and forming a stop layer comprising a metal oxide or a metal nitride over the patterned insulating material layer. The method includes forming a masking material over the stop layer, patterning the masking material with a via pattern, and transferring the via pattern of the masking material to a lower portion of the insulating material layer.

In accordance with other embodiments, a method of manufacturing a semiconductor device includes forming an etch stop layer comprising AlON over a workpiece, forming an insulating material layer over the etch stop layer, and patterning an upper portion of the insulating material layer with a conductive line pattern. A masking material is formed over the patterned insulating material layer, and the masking material is patterned with a via pattern. The via pattern of the masking material is transferred to a lower portion of the insulating material layer.

In accordance with other embodiments, a semiconductor device includes a plurality of first conductive lines disposed over a workpiece, an etch stop layer comprising AlON disposed over the plurality of first conductive lines, and a via disposed over the etch stop layer over one of the plurality of first conductive lines. The via is disposed in a lower portion of an insulating material layer. A second conductive line is disposed over the via. The second conductive line is disposed in an upper portion of the insulating material layer. A region of the etch stop layer beneath the via includes a material of the via.

In one aspect, embodiments described herein provide for a semiconductor device, having a plurality of first conductive lines disposed over a workpiece. An etch stop layer comprising AlON is disposed over the plurality of first conductive lines. A via is disposed over the etch stop layer over one of the plurality of first conductive lines, the via being disposed in a lower portion of an insulating material layer. The device further includes a second conductive line disposed over the via, the second conductive line being disposed in an upper portion of the insulating material layer. A region of the etch stop layer beneath the via includes a material of the via.

In another aspect, embodiments described herein provide for a semiconductor device having a conductive line disposed over a workpiece, and an etch stop layer comprising AlON disposed over the conductive line. The device further includes a homogenous dielectric layer on the etch stop layer, and a metal conductor directly on the etch stop and extending through the material of the etch stop layer to electrically contact the conductive line.

In yet another aspect, embodiment described herein provide for a semiconductor device having a first dielectric layer and a first conductor embedded in the first dielectric layer and having a top surface co-planar with a top surface of the first dielectric layer. A sieve-like etch stop layer is formed on the top surface of the first dielectric layer and on the top surface of the first conductor, the etch stop layer having a top surface. A second conductor is on the top surface of the sieve-like etch stop layer and extends through the sieve-like etch stop layer to electrically contact the first conductor.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a plurality of first conductive lines disposed over a workpiece;
an etch stop layer comprising AlON disposed over the plurality of first conductive lines;
a via disposed over the etch stop layer over one of the plurality of first conductive lines, the via being disposed in a lower portion of an insulating material layer; and
a second conductive line disposed over the via, the second conductive line being disposed in an upper portion of the insulating material layer, wherein a region of the etch stop layer beneath the via includes a material of the via.

2. The semiconductor device according to claim 1, wherein the plurality of first conductive lines, the via, or the second conductive line comprises copper or a copper alloy.

3. The semiconductor device according to claim 1, wherein the etch stop layer comprises a first etch stop layer, and wherein the semiconductor device further comprises a second etch stop layer disposed over the first etch stop layer.

4. The semiconductor device according to claim 3, wherein the second etch stop layer comprises nitrogen-doped carbide (NDC), oxygen-doped carbide (ODC), hydrogen and nitrogen doped carbide (HNDC), SiC, or tetraethyl orthosilicate (TEOS) comprising a thickness of about 1 nm to about 20 nm.

5. The semiconductive device according to claim 1, wherein the etch stop layer has a thickness of from about 1 nm to about 5 nm.

6. A semiconductor device, comprising:
a conductive line disposed over a workpiece;
an etch stop layer comprising AlON disposed over the conductive line;
a dielectric layer on the etch stop layer; and
a metal conductor directly on the etch stop layer and extending through the material of the etch stop layer to electrically contact the conductive line.

7. The semiconductor device according to claim 6, further comprising a second etch stop layer formed atop the etch stop layer, the second etch stop layer having an opening therein through which the metal conductor extends.

8. The semiconductor device according to claim 7, wherein the second etch stop layer comprises nitrogen-doped carbide (NDC), oxygen-doped carbide (ODC), hydrogen and nitrogen doped carbide (HNDC), SiC, or tetraethyl orthosilicate (TEOS) comprising a thickness of about 1 nm to about 20 nm.

9. The semiconductor device according to claim 6, wherein the conductive line is disposed within an insulator layer and wherein the etch stop layer has a first region interjacent the metal conductor and the conductive line and a second region interjacent the insulator and the metal conductor.

10. The semiconductor device according to claim 6, wherein the metal conductor includes a via portion in a lower region of the dielectric layer and a trench portion in an upper region of the dielectric layer.

11. The semiconductor device according to claim 6, wherein the etch stop layer has sieve characteristics allowing the metal conductor to extend through the etch stop layer.

12. The semiconductor device according to claim 10, wherein the trench portion has a major axis in a first direction and the conductive line has a second major axis in a second direction, the second direction being orthogonal to the first direction.

13. A semiconductor device comprising:
a first dielectric layer;
a first conductor embedded in the first dielectric;
an sieve-like etch stop layer formed on the top surface of the first dielectric layer and on the top surface of the first conductor, the etch stop layer having a top surface; and
a second conductor on the top surface of the sieve-like etch stop layer and extending through the sieve-like etch stop layer to electrically contact the first conductor.

14. The semiconductor device of claim 13, wherein the sieve-like etch stop layer comprises AlON.

15. The semiconductor device of claim 13, wherein the sieve-like etch stop layer comprises AlON and is adapted to allow growth of the second conductor through the sieve-like etch stop layer.

16. The semiconductor device of claim 13, wherein the sieve-like etch stop layer comprises a layer of AlON having a thickness of from about 1 nm to about 5 nm.

17. The semiconductor device of claim 13, further comprising a second etch stop layer on the top surface of the etch stop layer, the second etch stop layer having a discontinuity aligned with outer dimensions of the second conductor.

18. The semiconductor device of claim 17, wherein the second etch stop layer comprises nitrogen-doped carbide (NDC), oxygen-doped carbide (ODC), hydrogen and nitrogen doped carbide (HNDC), SiC, or tetraethyl orthosilicate (TEOS) comprising a thickness of about 1 nm to about 20 nm.

19. The semiconductor device of claim 13, wherein the second conductor is a via portion of a metallization layer formed in a lower region of a second dielectric layer.

20. The semiconductor device of claim 19, wherein first dielectric layer comprises a first material and the second dielectric layer comprises a second material, the same as the first material.

* * * * *